US009063560B2

(12) United States Patent
Uhl et al.

(10) Patent No.: US 9,063,560 B2
(45) Date of Patent: Jun. 23, 2015

(54) ARRANGEMENT FOR MOUNTING AN ELECTRONIC DISPLAY

(75) Inventors: Alexandre Uhl, Illkirch (FR); Aurelie Guillaume, Bennwihr (FR)

(73) Assignee: Delphi Technologies, Inc., Troy, MI (US)

( * ) Notice: Subject to any disclaimer, the term of this patent is extended or adjusted under 35 U.S.C. 154(b) by 448 days.

(21) Appl. No.: 13/635,930

(22) PCT Filed: Mar. 4, 2011

(86) PCT No.: PCT/EP2011/053322
§ 371 (c)(1),
(2), (4) Date: Nov. 14, 2012

(87) PCT Pub. No.: WO2011/113714
PCT Pub. Date: Sep. 22, 2011

(65) Prior Publication Data
US 2013/0063909 A1 Mar. 14, 2013

(30) Foreign Application Priority Data
Mar. 19, 2010 (FR) ..................................... 10 51985

(51) Int. Cl.
*H05K 5/00* (2006.01)
*H05K 7/00* (2006.01)
(Continued)

(52) U.S. Cl.
CPC ........... *G05G 1/105* (2013.01); *Y10T 29/49826* (2015.01); *H01H 9/181* (2013.01); *H01H 19/025* (2013.01)

(58) Field of Classification Search
CPC ......... H01H 19/025; H04N 9/44; H04N 9/78; G05G 1/105
USPC ............... 361/679.01–679.09, 679.1–679.19, 361/679.21–679.29, 679.31–679.45, 361/679.55–679.6, 724–747; 439/60, 439/151–160, 327, 328, 331, 638
See application file for complete search history.

(56) References Cited

U.S. PATENT DOCUMENTS 5,804,780 A 9/1998 Bartha
6,222,597 B1 4/2001 Maramatsu
(Continued)

FOREIGN PATENT DOCUMENTS

CN 201263257 6/2009
DE 102006022326 11/2007
(Continued)

OTHER PUBLICATIONS

International Search Report dated Apr. 4, 2011.

*Primary Examiner* — Jerry Wu
(74) *Attorney, Agent, or Firm* — Lawrence D Hazelton

(57) ABSTRACT

Arrangement for mounting an electronic display (30) at the centre of a rotary switch (12), including:
- a support board (18),
- an electrical connection device (74) which is arranged on the board (18) in order to connect the display (30) to an electronic control circuit,
- a cylindrical box (32) which is mounted on the board and which forms the fixed central body of the rotary switch (12),
- an annular body (34) forming a rotor which is mounted in rotation on the cylindrical box about an axis so as to form a turning part of the rotary switch (12), characterized by the fact that the cylindrical box (32) includes a container designed to receive the display (30) by transversal insertion, relative to the axis of the rotary switch (12).

13 Claims, 4 Drawing Sheets

(51) Int. Cl.

| | |
|---|---|
| ***H01R 13/62*** | (2006.01) |
| ***A47B 96/06*** | (2006.01) |
| ***G05G 1/10*** | (2006.01) |
| ***H01H 9/18*** | (2006.01) |
| ***H01H 19/02*** | (2006.01) |

(56) References Cited

U.S. PATENT DOCUMENTS

| | | | | |
|---|---|---|---|---|
| 2003/0030973 | A1* | 2/2003 | Kirchhevel et al. | 361/681 |
| 2005/0199737 | A1 | 9/2005 | de Pauw et al. | |
| 2005/0224322 | A1* | 10/2005 | Kikuya et al. | 200/11 R |
| 2007/0084941 | A1 | 4/2007 | de Pauw et al. | |

FOREIGN PATENT DOCUMENTS

| | | |
|---|---|---|
| EP | 0982622 | 3/2000 |
| EP | 1555684 | 7/2005 |
| JP | 2001184969 | 7/2001 |
| WO | 98/29886 | 7/1998 |

* cited by examiner

ARRANGEMENT FOR MOUNTING AN ELECTRONIC DISPLAY

TECHNICAL FIELD

The present invention relates to an arrangement for mounting an electronic display at the centre of a rotary switch, in particular in a control panel designed to be arranged in the dashboard of a motor vehicle.

TECHNOLOGICAL BACKGROUND OF THE INVENTION

Arrangements are already known which allow the mounting of a liquid crystal electronic display (LCD) at the centre of a rotary switch designed to be mounted in a control panel, in particular to control a ventilation and air-conditioning device in the dashboard of a motor vehicle.

For example, document EP1884857 describes such a type of arrangement including a printed circuit board on which is mounted a generally cylindrical box forming the fixed central body for the rotary knob of a rotary switch. The display is mounted on the upper axial end of the cylindrical body and an electrical connection web extends from the connection edge of the display to a connection device mounted on the printed circuit board.

Although having proved satisfactory in many configurations, this type of arrangement requires relatively numerous and complex assembly steps in certain cases. Moreover, the electrical connection of the display to the printed circuit board is sometimes difficult to make which can pose problems of reliability.

SUMMARY OF THE INVENTION

The present invention is intended to improve the arrangement described above by proposing a simple and economical solution.

To this end, the invention proposes an arrangement for mounting an electronic display at the centre of a rotary switch including:

- a support board,
- an electrical connection device which is arranged on the board in order to connect the display to an electronic control circuit,
- a cylindrical box which is mounted on the board and which forms the fixed central body of the rotary switch,
- an annular body forming a rotor which is mounted in rotation on the cylindrical box about an axis so as to form a turning part of the rotary switch, characterised by the fact that the cylindrical box includes a container designed to receive the display by transversal insertion, relative to the axis of the rotary switch.

By means of the invention, the installation of the display is easier to perform during assembly, preventing improper positioning and minimising risks of damage to the display. The transversal insertion allows in particular an axial retention of the display in the cylindrical box to be ensured which then allows the cylindrical box to be turned over during assembly with the support board.

In accordance with other characteristics of the invention:

- the container includes slide means which cooperates with complementary portions of the display so as to allow the insertion of the display in the container by transversal sliding;
- the outline of the complementary portions and the outline of the slide means are able to fulfill a keying function to prevent mounting of the display the wrong way up;
- the cylindrical box includes at its upper axial end a transversal wall provided with a window defining the display zone of the display;
- a protective window is mounted on the upper axial end of the cylindrical box, after insertion of the display in the container through a transversal opening, and the protective window includes at least one axial fixing tongue which extends through the transversal opening in order to prevent any removal of the display through the said opening;
- the electrical connection device includes a flexible connector made of elastomer which is designed to be axially compressed between connection terminals of the board and connection terminals of the display;
- a base is arranged on the board, in the central space inside the cylindrical box so that, during assembly of the cylindrical box on the board, the display rests on an axial end portion of the base;
- the flexible connector is mounted in the base;
- the base includes at least one tenon which is designed to cooperate with the display in order to retain it transversally in the container;
- the base is made of opaque material and includes an internal conduit which extends axially from a light source arranged on the board to the lower face next to the display so as to optimise the backlighting of the display by the source while minimising leakage of light;
- the support board is a printed circuit board;

The invention also proposes a control panel, in particular for a motor vehicle dashboard, including a frame on which are mounted:

- a printed circuit board forming a support board,
- an intermediate board which includes housings for a plurality of switches, and
- an external panel, characterised by the fact that it includes an arrangement in accordance with one of the characteristics mentioned above in which the cylindrical box is made in one piece with the intermediate board.

The invention also proposes a method for assembly of the control panel, characterised by the fact that it includes the following successive steps:

- transversal insertion of the display in the cylindrical box belonging to the intermediate board,
- mounting of the intermediate board on the external panel,
- mounting of the printed circuit board on the intermediate board,
- mounting of the frame on the circuit board and assembly of the frame with the intermediate board and the external panel.

Preferably, the method also includes a step of mounting a protective window on the cylindrical box just after the transversal insertion of the display in order to protect the display during the subsequent assembly operations, and a step of mounting the base in the cylindrical box before the step of mounting the intermediate board on the external panel.

BRIEF DESCRIPTION OF THE DRAWINGS

Other characteristics, aims and advantages of the invention will become apparent on reading the detailed description which follows with reference to the attached drawings, given by way of a non-limiting example and in which.

DESCRIPTION OF THE PREFERRED EMBODIMENTS

In the remainder of the description, identical or similar elements will be designated by the same references.

Figure 1:
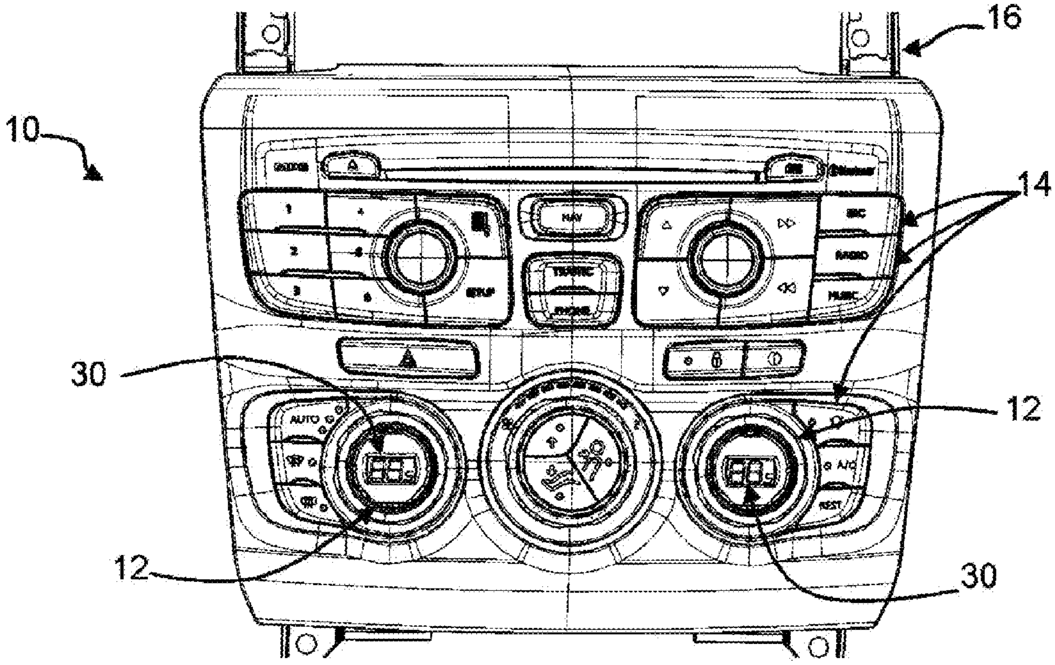
FIG. 1 is a view from above which shows a control panel provided with an arrangement for the mounting of an electronic display at the centre of a rotary switch in accordance with the teachings of the invention.
Figure 2:
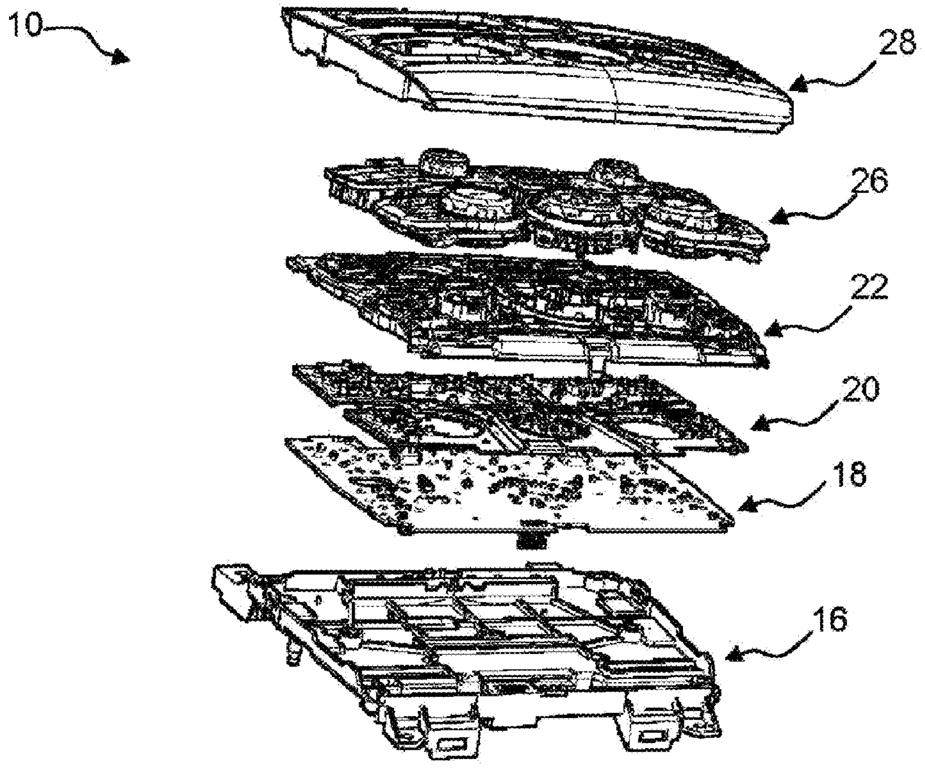
FIG. 2 is an exploded perspective view which shows the control panel of FIG. 1.
Figure 3:
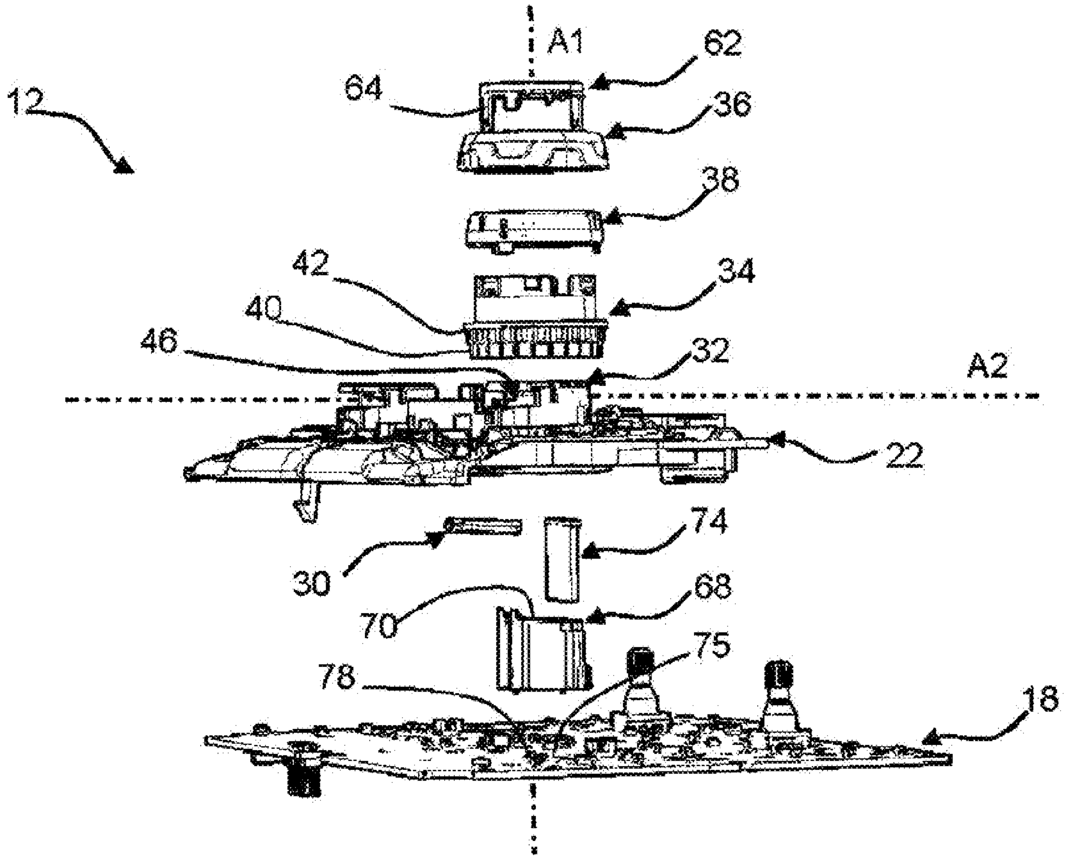
FIG. 3 is an exploded perspective view which shows the different elements forming a rotary switch of FIG. 1 in accordance with the teachings of the invention, in particular the cylindrical box forming the fixed central body of the switch.

In FIGS. 1 and 2, has been shown by way of example a motor vehicle control panel 10 including rotary switches 12 and pushbutton switches 14 designed to control different pieces of equipment of a motor vehicle, in particular the ventilation and air-conditioning system of the vehicle.

In accordance with the embodiment shown, the control panel 10 includes a frame 16 on which are respectively assembled a printed circuit board 18 forming a support board, a sheet 20 of flexible material having in particular a sealing function, an intermediate board 22 including housings 24 provided for mounting of elements 26 of switch 12, 14, and an external panel 28 or decorative panel.

The two lateral rotary switches 12 of the control panel 10 are each provided with an electronic display 30 which is arranged at the centre of the rotary switch 12, in accordance with the teachings of the invention. Each electronic display 30 is here formed by a liquid crystal device (LCD) in the form of a small plate.

Considering in particular FIGS. 3 to 8, which show the right lateral rotary switch 12 of axis A1, the rotary switch 12 includes a cylindrical box 32 which is made in one piece with the intermediate board 22 and an annular body forming a rotor 34 which is mounted in rotation, about the axis A1, on the cylindrical box 32.

Figure 4:
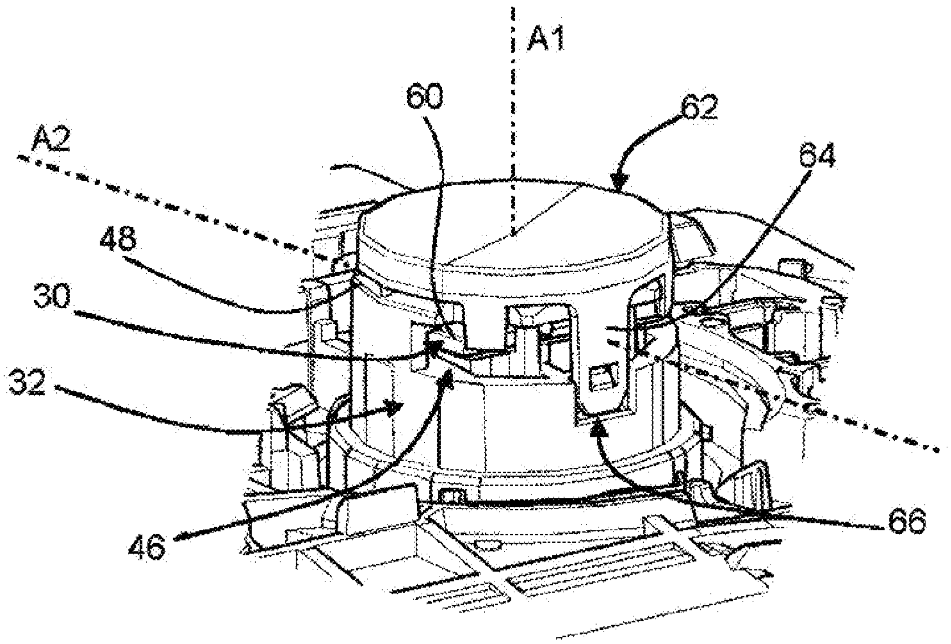
FIG. 4 is a perspective view which shows a part of the rotary switch of FIG. 3 without the rotary elements of the switch to reveal the container receiving the electronic display and a protective window mounted on the cylindrical box.
Figure 5:
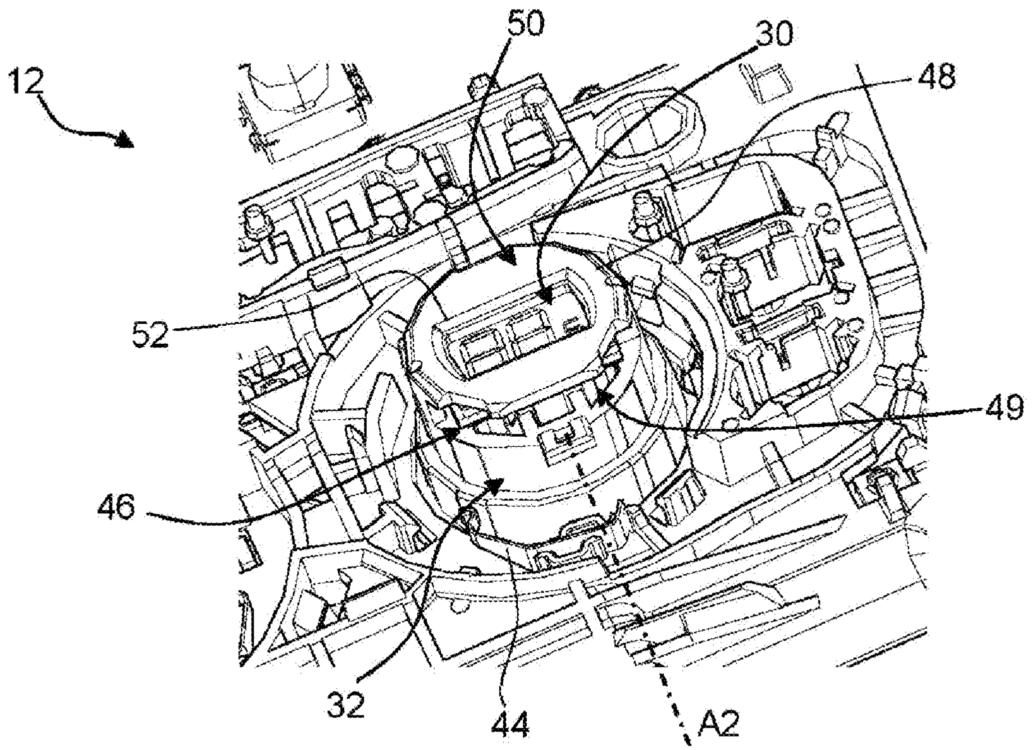
FIG. 5 is a perspective view similar to that of FIG. 4 in which the protective window has been omitted.

In the remainder of the description, an axial orientation will be used along the axis A1 of the rotary switch 12 orientated from the bottom to the top considering FIG. 4.

The rotor 34 is here provided at its upper axial end with an operating knob 36 which is fixed on the rotor 34 by means of an intermediate ring 38. The lower axial end section 40 is designed to cooperate with electrical switching means (not shown) arranged on the printed circuit board 18 in order to produce a control signal linked to the angular position of the rotor 34. Moreover, an intermediate section of the rotor 34 here forms a cam surface 42 designed to cooperate with a flexible elastic strip 44 mounted in the intermediate board 22 in order to angularly index the rotor 34 and in order to produce a tactile force-feedback when a user manipulates the knob 36.

In accordance with the teachings of the invention, the cylindrical box 32 includes a container 46 designed to receive the display 30 by insertion in a transversal direction A2, relative to the axis A1 of the rotary switch 12. The container 46 here has the general form of a slot which extends generally in a transversal plane at the upper axial end 48 of the cylindrical box 32 and which includes a main opening 49 through which the display 30 is inserted. The container 46 is axially upwardly defined by a transversal wall 50 of the cylindrical box 32 which is provided with a window 52, here generally rectangular, allowing definition of the display zone of the display 30.

The container 46 includes slide means 54 which cooperate with complementary portions of the display 30 so as to allow insertion of the display 30 in the container 46 by transversal sliding. More precisely, the display 30 here includes two small plates 56, 58 one of which is wider than the other which forms a lateral step 60 designed to be received in the slide means 54. The lateral step 60 also allows, in co-operation with the slide means 54, the creation of a keying function since its outline prevents the insertion of the display 30 the wrong way up, i.e. with the display face downwards.

Advantageously, a protective window 62 is mounted on the upper axial end 48 of the cylindrical box 32, just after insertion of the display 30 in the container 46. The protective window 62 here includes peripheral axial tongues 64 which are designed to fit elastically into associated notches 66 of the cylindrical box 32 in order to retain the protective window 62 on the cylindrical box 32. One of the tongues 64 here extends through the transversal opening 49 so as to prevent any possible removal of the display 30 through the said opening 49.

In accordance with the embodiment shown, a base 68 is arranged on the printed circuit board 18, in the central space inside the cylindrical box 32. The display 30 is designed to rest on an upper axial end surface 70 of the base 68 and to be pressed axially by the base 68 against the transversal wall 50 of the cylindrical box 32.

Figure 6:
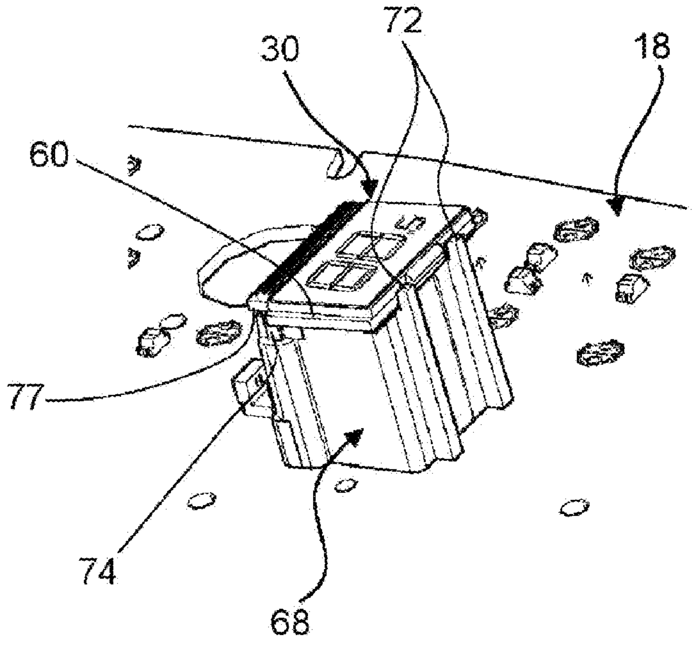
FIG. 6 is a perspective view which shows the support base of the electronic display with which the rotary switch of FIG. 3 is provided.
Figure 7:
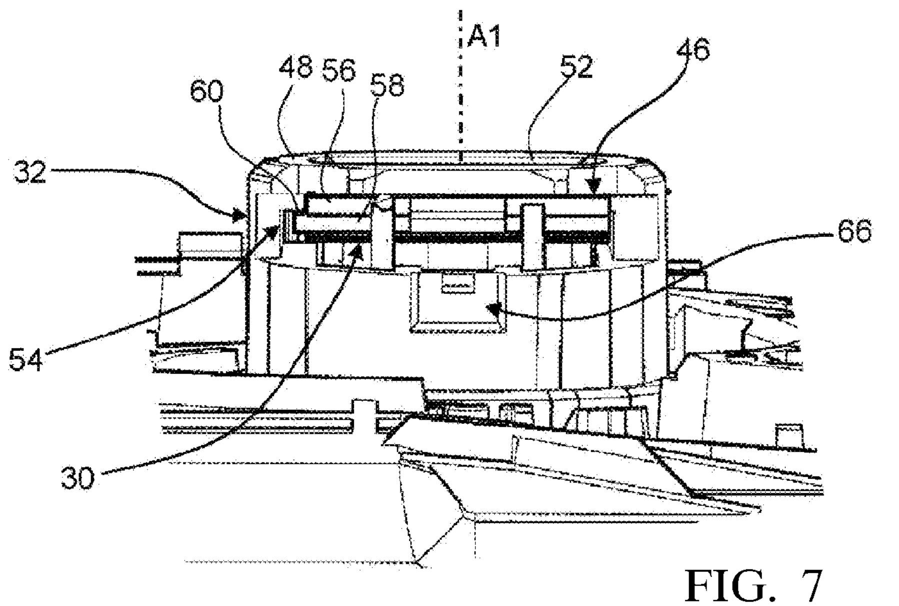
FIG. 7 is a side view which shows the cylindrical box and the arrangement of the display in the container of the rotary switch of FIG. 3.
Figure 8:
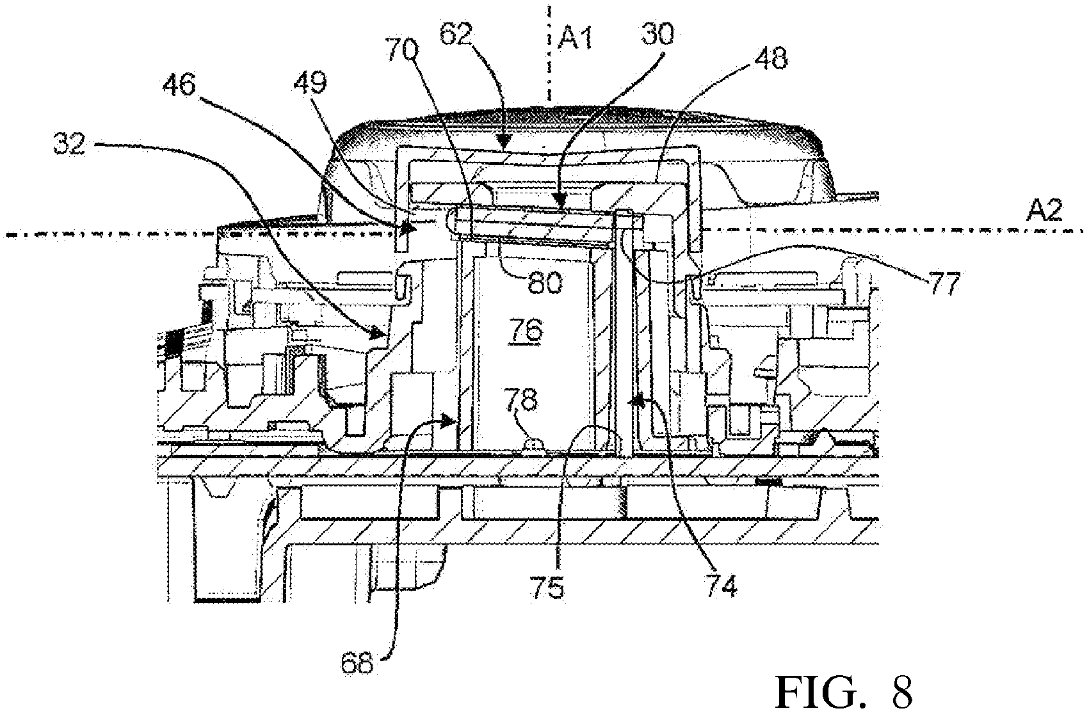
FIG. 8 is a view in axial section which shows the rotary switch of FIG. 3.

As shown in particular in FIG. 6, the upper axial end of the base 68 includes two axial tenons 72 which cooperate with the transversal edge of the display 30, on the side of the transversal opening 49, so as to retain the display transversally in the back of the container 46.

Advantageously, a flexible connector 74 made of elastomer of the Zebra type is mounted in the base 68 so as to be compressed axially between terminals or connection areas 75 arranged on the printed circuit board 18 and the terminals or connection areas 77 of the display 30, the flexible connector 74 forming an electrical connection device with the control circuit arranged on the printed circuit board 18.

Preferably, the base 68 is made of an opaque material and includes an internal conduit 76 which extends axially from a light source 78 arranged on the printed circuit board 18 to the lower face 80 next to the display 30 so as to perform a function of back-lighting of the display 30 by the light source 78 while minimising leakage of light.

A method is now described for assembling the control panel 10 in accordance with the teachings of the invention. The assembly method includes the following successive steps:

- transversal insertion of the display 30 in the cylindrical box 32 belonging to the intermediate board 22,
- mounting of the intermediate board 22 on the external panel 28,
- mounting of the printed circuit board 18 on the intermediate board 22, mounting of the frame 16 on the printed circuit board 18 and assembly of the frame 16 with the intermediate board 22 and the external panel 28.

Preferably, the protective window 62 is mounted on the cylindrical box 32 just after the axial insertion of the display 30 in order to protect the display 30 during the subsequent assembly operations.

In accordance with another advantageous characteristic of the method in accordance with the invention, the base 68 is mounted in the cylindrical box 32 before the step of mounting the intermediate board 22 on the external panel 28.

The invention claimed is:

1. An arrangement for mounting an electronic display at the center of a rotary switch, said arrangement comprising:

a support board;

an electrical connection device which is arranged on the board in order to connect the display to an electronic control circuit;

a cylindrical box which is mounted on the board and which forms the fixed central body of the rotary switch;

an annular body forming a rotor which is mounted in rotation on the cylindrical box about an axis so as to form a turning part of the rotary switch, wherein the cylindrical box includes a container designed to receive the display by transversal insertion, relative to the axis of the rotary switch and by the fact that the container includes slide means which cooperate with complementary portions of the display so as to allow the insertion of the display in the container by transversal sliding; and a protective window mounted on the upper axial end of the cylindrical box, after insertion of the display in the container through a transversal opening, wherein the protective window includes at least one axial fixing tongue which extends through the transversal opening in order to prevent any removal of the display through the opening.

2. The arrangement of claim 1, wherein the outline of the complementary portions and the outline of the slide means are able to fulfill a keying function to prevent mounting of the display upside down.

3. The arrangement of claim 1, wherein the cylindrical box includes at its upper axial end a transversal wall provided with a window defining the display zone of the display.

4. The arrangement of claim 1, wherein the electrical connection device includes a flexible connector made of elastomer which is designed to be compressed axially between connection terminals of the board and connection terminals of the display.

5. The arrangement of claim 1, wherein a base is arranged on the board, in the central space inside the cylindrical box so that, during assembly of the cylindrical box on the board, the display rests on an axial end portion of the base.

6. The arrangement of claim 5, wherein the flexible connector is mounted in the base.

7. The arrangement of claim 5, wherein the base includes at least one tenon which is designed to cooperate with the display in order to retain it transversally in the container.

8. The arrangement of claim 5, wherein the base is made of opaque material and includes an internal conduit which extends axially from a light source arranged on the board to the lower face next to the display so as to optimize the backlighting of the display by the source while minimizing leakage of light.

9. The arrangement of claim 1, wherein the support board is a printed circuit board.

10. The arrangement of claim 5, wherein the flexible connector is mounted in the base.

11. The arrangement of claim 6, wherein the base includes at least one tenon which is designed to cooperate with the display in order to retain it transversally in the container.

12. The arrangement of claim 6, wherein the base is made of opaque material and includes an internal conduit which extends axially from a light source arranged on the board to the lower face next to the display so as to optimize the backlighting of the display by the source while minimizing leakage of light.

13. The arrangement of claim 7, wherein the base is made of opaque material and includes an internal conduit which extends axially from a light source arranged on the board to the lower face next to the display so as to optimize the backlighting of the display by the source while minimizing leakage of light.

* * * * *